United States Patent [19]

Ryan, Jr.

[11] Patent Number: 5,400,345
[45] Date of Patent: Mar. 21, 1995

[54] COMMUNICATIONS SYSTEM TO BOUNDARY-SCAN LOGIC INTERFACE

[75] Inventor: Frederick W. Ryan, Jr., New Haven, Conn.

[73] Assignee: Pitney Bowes Inc., Stamford, Conn.

[21] Appl. No.: 847,516

[22] Filed: Mar. 6, 1992

[51] Int. Cl.$^6$ .............................. G01R 31/28
[52] U.S. Cl. ................... 371/22.3; 371/22.1
[58] Field of Search ............... 371/22.1, 22.3, 22.4, 371/25.1; 324/158 R; 368/201

[56] References Cited

U.S. PATENT DOCUMENTS

| | | | |
|---|---|---|---|
| 4,365,293 | 12/1982 | Holtz | 364/200 |
| 4,398,264 | 8/1983 | Cooper et al. | 364/900 |
| 4,550,366 | 10/1985 | Toyama et al. | 364/136 |
| 5,056,093 | 10/1991 | Whetsel | 371/22.3 |
| 5,103,450 | 4/1992 | Whetsel | 371/22.3 |
| 5,115,435 | 5/1992 | Langford, II et al. | 371/22.3 |

OTHER PUBLICATIONS

C. Bardwell-Jones, "SSD . . . " Proceed. of the 3rd Annual Motion Control Tech. Conf. E., Mar. 1991, Boston, Mass., pp. 1–25.
R. P. Brennan, "The SERCOS Inter. . . . " present at: PCIM/Power Quality '90 Phil, Pa. pp. 1–8 Oct. 24, 1990.
T. Bucella, "Using The Trajectory Regulator Protocol," Proceed of the 3rd Annual Conf/E, Mar. 1991, Boston, Mass. pp. 1–8.
S. Cortese, "SERCOS-Real . . . " Proceed. of the 3rd Annual Motion Control Tech. Conf. E., Mar. 1991, Boston, Mass. pp. 14–25.
S. Cortese, "An Evaluation of SSD's Link Interface," Apr. 5, 1991.
M. Dolin, "Boundary Scan Makes Inroads into PCB Testing," Computer Design, pp. 50–51, Dec. 1991.
Weaver, Lachner & Boekestein, "A Compact . . . " Procceed. of the 3rd Annual Mot. Cont. Tech. Conf/E. Mar. 1991 Bost. Mass. pp. 9–13.
Int. Stand. Organ., ISO/TC97: Inf. Proc. Sys. Open Syst. Inter. Basic Ref. Model, Draft Int. Stand ISO/-DIS 7498. Apr. 1982.
"IBM Synchronous Data Link Control," General Info. IBM form GA27-3093.
EIA recommend. stand. RS485: Stand. for elect. char. of gen. and rec. for use in bal. dig. multi-point syst EIA Apr. 1983.
SN65ALS176 RS422A an RS-485 differential bus transceivers: Interface Circuits Data book. Texas Instruments, 1991.
International Standard ISO 8802-2 IEEE Std. 802.2 "Information Processing systems—Local area . . . " Dec. 31, 1989.
FCC Class B/VDE 0871.
IEEE Standard 1149.1-1990, "IEEE Stand. Test Access Port and Boundary . . . ", IEEE Inc. 345 E. 47th St. N.Y. N.Y. 10017.

*Primary Examiner*—Vincent P. Canney
*Attorney, Agent, or Firm*—David E. Pitchenik; Melvin J. Scolnick

[57] ABSTRACT

A control node for controlling a predetermined function in response to messages transmitted over a communications bus and for responding to a second class of such messages to exercise boundary-scan logic to test the control node. The boundary-scan logic is implemented in accordance with ANSI/IEEE Standard 1149.1. The second class of messages include Scan Command messages which contain data for controlling the state of the Test Access Port of the boundary-scan logic, Scan Test Data messages which transmit data to be loaded into the instruction registers or the test data registers of the boundary-scan logic, and Scan Results Request messages which control the node to return the test results over the communications bus.

20 Claims, 4 Drawing Sheets

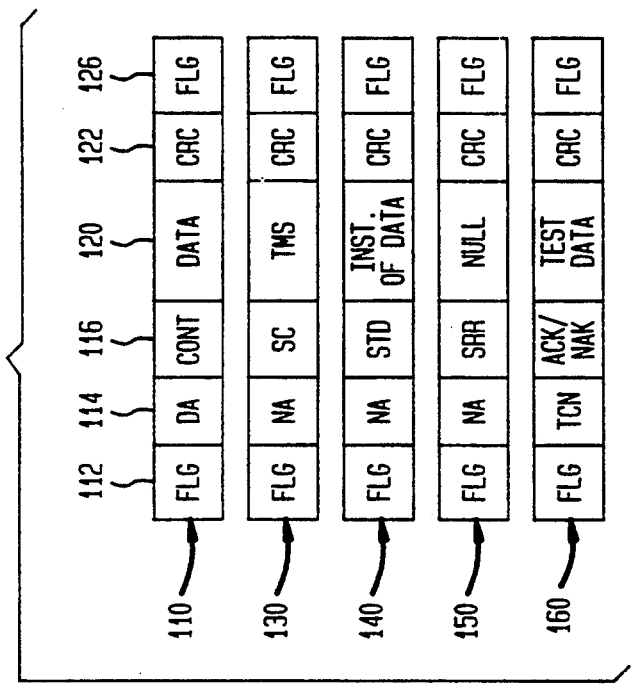
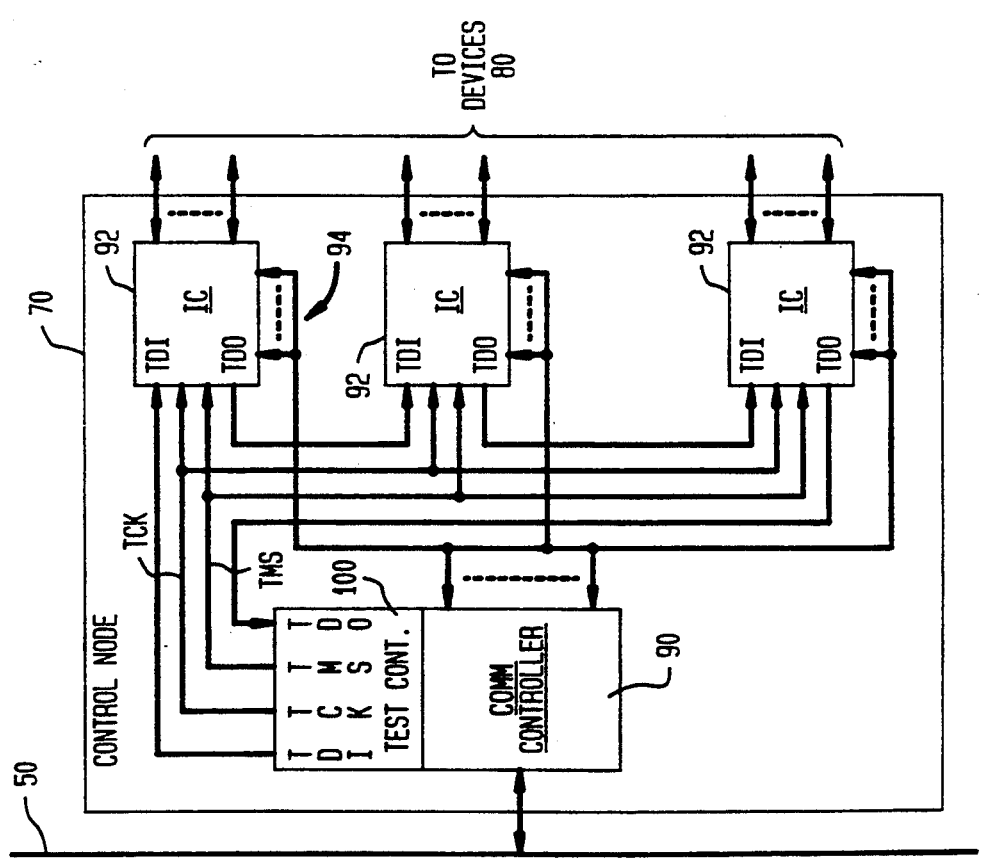

COMMUNICATIONS SYSTEM TO BOUNDARY-SCAN LOGIC INTERFACE

BACKGROUND OF THE INVENTION

This invention relates to testing of digital circuits. More particularly, it relates to a communications network comprising one of more nodes which incorporate boundary-scan logic for testing wherein the boundary-scan logic maybe exercised over the communications network.

Boundary-scan testing of integrated circuits is a well known technique for testing complicated digital circuits. ANSI/IEEE Standard 1149.1, *IEEE Standard Test Access Port and Boundary-Scan Architecture* has been developed to provide a commercial standard for boundary-scan testing and has been widely accepted by integrated circuit manufacturers FIG. 1 shows conventional integrated circuit 10, which incorporates boundary scan logic for testing. Circuit 10 includes on-chip logic 20 to implement a predetermined function in a conventional manner. Logic 20 communicates with the external world through pins 22. To implement boundary-scan testing a test data register 30 of cells 32 is also included on integrated circuit 10. Cells 32 are connected between logic 20 and pins 22 and are also connected to form a serial shift register.

Integrated circuit 10 also includes a Test Access Port TAP comprising pins 40, 42, 44, 46 and 48 for, respectively, connection of a test data input signal TDI, a test clock TCK, a test mode select signal TMS, a test data output signal TDO, and an optional reset signal TRST. Signals TCK and TMS are connected through pins 42 and 44 to a TAP controller 34 together with, if provided, reset signal TRST through pin 48. Data TDI is connected through pin 40 to test data register 30 and to instruction register 36. Output data is connected to pin 46 through control 38 from either array 30 or instruction register 36 to provide signal TDO.

FIG. 2 shows a more detailed block diagram of the boundary-scan logic of FIG. 1. TAP controller 34 is a state machine which generates clocks and controls to control the operation of the boundary-scan test logic in response to control signals TMS which are clocked by clock TCK. Controller 34 maybe reset by signal TRST; though in the preferred embodiments discussed herein TRST is not used. In response to controller 34 data TDI is shifted into either test data registers 30 or instruction register 36. As data is shifted into registers 30 and 36 previous data is shifted out through circuit 38 to provide, under control of controller 34 output signal TDO.

Under control of instruction register 36 data in test data register 30 can be applied to the inputs of logic 20, or output pins of pins 22, or the state of pins 22 maybe loaded into corresponding cells 32 of register 30. After the test data is applied and the results capture the results are shifted out of register 30, as new test data is shifted in, and returned for analysis.

Those skilled in the art will be aware that boundary-scan logic, as defined in Standard 1149.1 includes numerous other features which have not been described, and which are not considered necessary for an understanding of the subject invention.

While boundary-scan testing, as described above, has gained wide acceptance its use heretofore has been largely limited to physically compact systems where parallel signal interconnection is provided through motherboards or backplanes or similar techniques, where the addition of four or five extra wires for control of the boundary-scan logic is not of major consequence. Boundary-scan logic has been of less advantage in more physically distributed systems comprising one or more control nodes interconnected by a communications network. In such systems a major design criteria is to reduce the number of signal lines or channels necessary for the distribution of signals among the various nodes. In many such systems serial communications is used for this purpose.

Thus, it is an object of the subject invention to provide a system for control of boundary-scan test logic in a communications network comprising a plurality of control nodes.

BRIEF SUMMARY OF THE INVENTION

The above object is achieved and the disadvantages of the prior art are overcome in accordance with the subject invention, by mean of a control node for use in a communications network and responsive to signals transmitted on a communications bus connecting that network, and which includes boundary-scan test logic for testing the operability of the node. The node includes first apparatus responsive to a first class of messages transmitted by the signals to control a predetermined function; and also includes second apparatus responsive to a second class of such messages for exercising boundary-scan logic to test the node.

In accordance with one aspect of the subject invention the communications bus is a serial bus.

In accordance with another aspect of the subject invention the first apparatus includes a communications controller responsive to the first class of messages to generate first control signals, and circuitry responsive to the first control signals to implement the predetermined function; and the second apparatus includes the communications controller which is responsive to the second class of messages to generate second control signals, and a test controller responsive to the second control signals to exercise the boundary-scan logic.

In accordance with another aspect of the subject invention the second class of messages includes a scan command message for controlling the state of TAP controllers in the boundary-scan logic, and the scan command message includes TMS data, and the test controller serially transmits the TMS data to the boundary-scan logic.

In accordance with another aspect of the subject invention the second class of messages includes a send test data message for transmission of test data to the boundary-scan logic, the test data is temporarily stored in the test controller, and output of the test data to the boundary-scan logic is controlled by a sub-machine whose state structure is substantially similar to that of the TAP controllers of the boundary-scan logic.

Thus, it can be seen that the subject invention advantageously achieves the above object and overcomes the disadvantages of the prior art by providing a control node having boundary-scan logic wherein the boundary-scan logic maybe controlled by messages transmitted over a communications bus with the same format and protocol as operation control messages, thus eliminating the need for any additional boundary-scan signal lines. A further advantage of a the subject invention is that cost of the additional circuitry at the nodes is minimized since the sequence of operations of the boundary-scan logic is controlled by data transmitted in the test control messages; minimizing the need for capability at each node.

Other objects and advantages of the subject invention will be apparent to those skilled in the art from consideration of the detailed description set forth below and of the attached drawings.

BRIEF DESCRIPTION OF THE DRAWINGS

FIG. 3 shows a block diagram of a serial communications network including control nodes in accordance with the subject invention.

FIG. 4 shows a block diagram of a control node of FIG. 3.

FIG. 5 shows formats of messages for communication with the control node of FIG. 4.

DETAILED DESCRIPTION OF THE PREFERRED EMBODIMENT OF THE SUBJECT INVENTION

Figure 1:
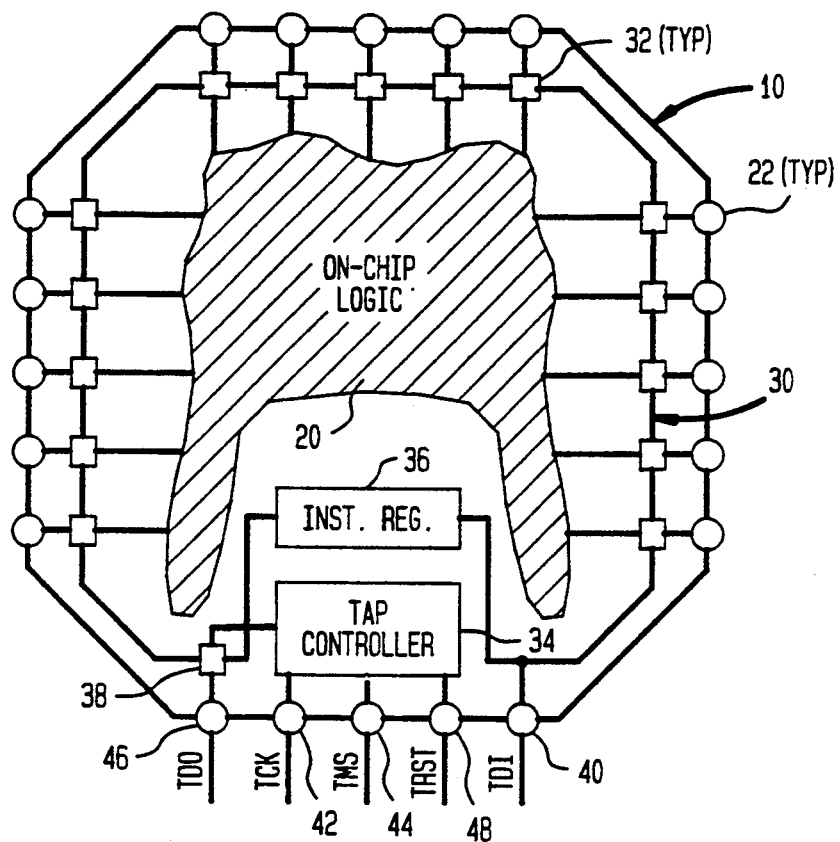
FIG. 1 shows a schematic representation of a stylized, conventional integrated circuit which includes boundary-scan logic in accordance with ANSI/IEEE Standard 1149.1.
Figure 2:
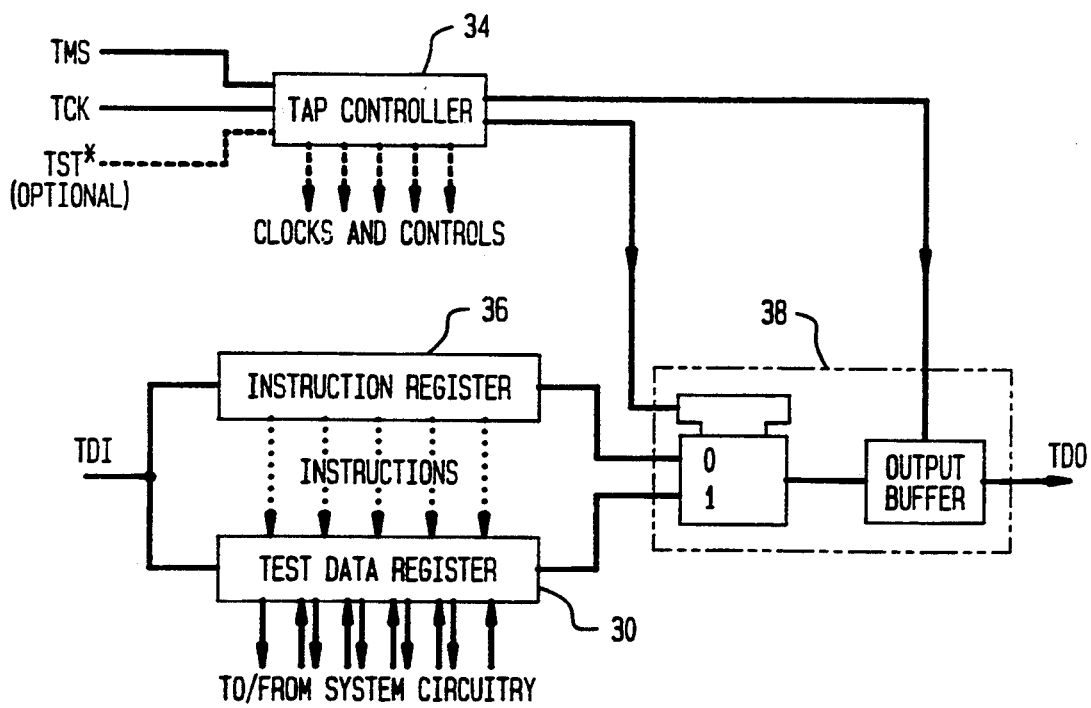
FIG. 2 shows a block diagram of the boundary-scan logic of FIG. 1.

FIG. 3 shows a block diagram of a communications network in accordance with the subject invention. Typically, communications bus 50, which is preferably a serial bus, connects a central control node 60 and a plurality of control nodes 70 to perform a predetermined function. Nodes 70 operate under the overall, system control of central control node 60 to Control the operation of devices 80. For example, in a paper handling system devices 80 might be motors, actuators, and sensors for controlling the motion of paper items as they move through a system such as an inserter system for insertion of paper sheets into envelopes to form mail pieces. Controllers 70 would output drive signals to motors, input shaft position data from the motors, energized actuators, and receive input signals from sensors. System control would be provided by messages exchanged on bus 50 between central control node 60 and control nodes 70, whereby control nodes 70 would return current status information to central control node 60 and central control node 60 would provide operating instructions to control nodes 70.

Operator input to control nodes 60 is provided by I/O 82.

A preferred architecture for such a communications network is described in commonly owned, co-pending U.S. patent application Ser. No. 07/847,542 for: Flexible Communication Architecture For Motion Control System; filed on even date herewith. This architecture provides a highly advantageous communications network structure which has a capability both for high-band width, scheduled communications between central control node 60 and various of control nodes 70 and event-driven communication among central control node 60 and various others of control nodes 70.

Generally, however the exact nature of the communications network used with the subject invention is not considered critical and only such details of the communications in the preferred embodiment described herein as are necessary for an understanding of the subject invention will be given.

FIG. 4 shows a block diagram of control node 70 which includes a communications controller 90 for controlling communication on bus 50 in accordance with a predetermined format and protocol. Controller 90 response to a first class of messages, i.e. those messages intended to control the predetermined function that constitutes the normal application of control node 70, to generate and receive control, data and timing signals to and from integrated circuits 92 over conventional printed wiring 94. Integrated circuits 92 provide outputs to and receive inputs from device 80; either directly or through conventional driver circuitry.

The particular normal application of control node 70 is not believed to be of any importance to an understanding of the subject invention and, in general, a person in ordinary skill in the art will easily be able to implement a particular normal application in any system, such as a paper handling system, without difficulty.

In accordance with the subject invention integrated circuits 92 are provided with boundary-scan logic, preferably in accordance with Standard 1149.1 as described above. Control nodes 70 also includes test controller 100 to generate signals TDO, TCK, TMS and receive signal TDI from the boundary-scan logic. Note that the TDO output of test controller 100 is connected to the TDI input of the first of integrated circuits 92, and its TDO output is connected to the next TDI input, and so on until the last TDO output is connected to the TDI input of test controller 100 so that each test data register of integrated circuits 92 is connected in series to form a single extended register which receives test data from the TDO output of test controller 100, and returns results data to the TDI input. Signals TCK and TMS are transmitted in parallel to each of the TAP controllers of integrated circuits 92, so that each of the TAP controllers is always in the same state as the others.

FIG. 5 shows various message formats which may be used in a preferred embodiment of the subject invention. Message 110 is a generalized message which includes a flag field 112 which contains a predetermined, fixed data pattern which serves as a flag to indicate the beginning of a message. Field 114 contains a destination address which identifies the node for which the message is intended. Field 116 is a control field which identifies the type of message. Field 120 is an optional field for data being transmitted to the destination node. Field 122 contains a cyclic redundancy check sum used by controller 90 to determine that a message has been accurately received. Field 126 contains an end of message flag.

In a preferred embodiment each node will respond to receipt of a message by transmitting and Acknowledge/Not Acknowledge message having the same general format as message 110.

Message 130 is a Scan Command message for controlling the state of the TAP controllers in integrated circuits 92 of control node 70. Field 114 contains the address of control nodes 70, field 116 identifies message 130 as a Scan Command and field 120 contains 1 byte of data to be output as the TMS signal, as will be described below.

Message 140 is a Send Test Data message which transmits eight bytes of data to be output by test controller 100 to either the test data registers or the instruction registers of integrated circuits 92, as will be described further below. Field 114 again contains the address of node 70 and field 116 identifies message 140 as a Send Test Data message. Field 120 contains the above mentioned eight bytes of data.

Message 150 is a Scan Results Request message which request control node 70 to return the results data generated by the boundary-scan logic. Field 114 contains the address of node 70 and field 116 identifies message 150 as Scan Results Request. Message 150 does not include any data.

Message 160 is the response message generated by node 70 in response to a Scan Results Request message 150. Field 114 contains the address of the test control node, and field 116 contains an Acknowledge/Not Acknowledge code to indicate whether or not the Scan Results Request message has been correctly received. Field 120 contains eight bytes of data shifted out of the boundary-scan logic as the previous test data was shifted in.

In accordance with a preferred embodiment of the subject invention the test control node which generates messages 130, 140 and 150 is central control node 160. However, it is also within the contemplation of the subject invention that the test control node may be any node on the network which has the capacity to generate messages, or may be a test device temporarily connected to communications bus 50.

Figure 6:
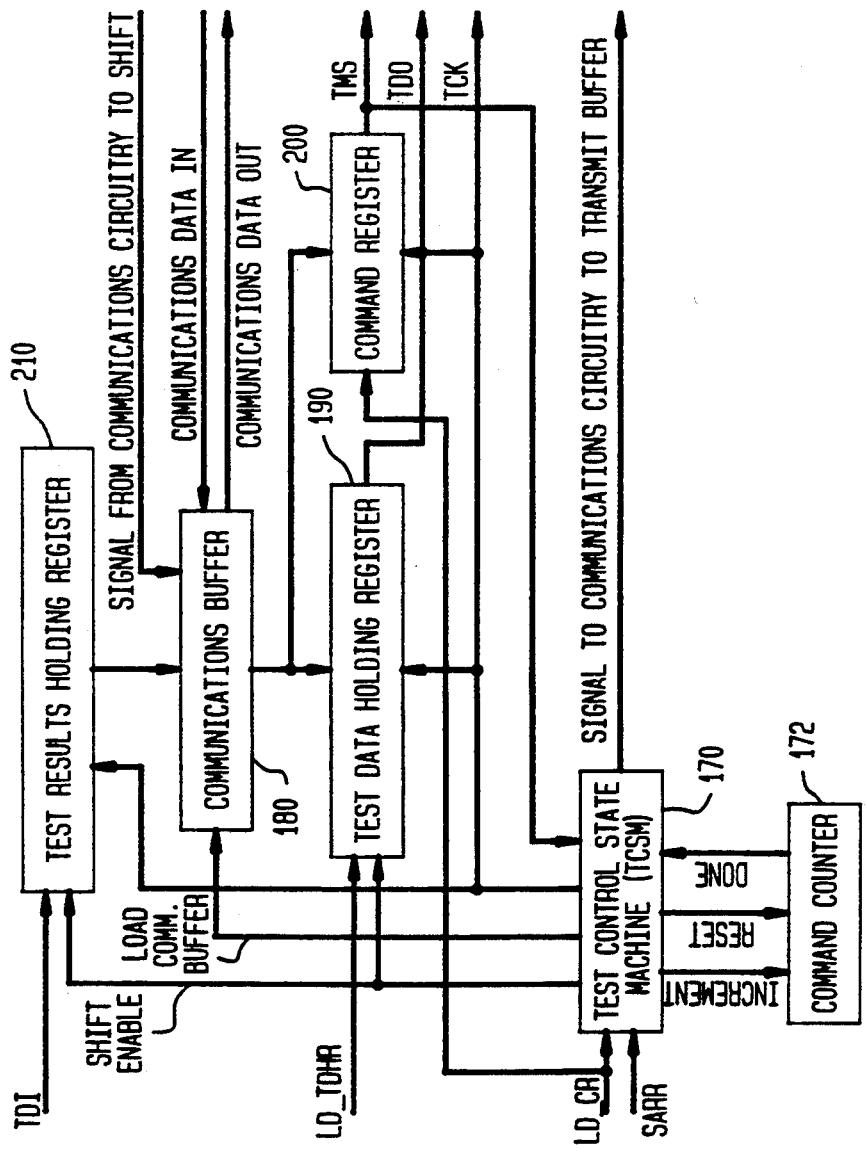
FIG. 6 shows a block diagram of a test controller included in the control node of FIG. 4.

FIG. 6 shows a block diagram of test controller 100 which operates under the control of test control state machine 170 and command counter 172. (Those skilled in the art will recognize that test controller 100 may also readily be implemented using a microprocessor or other conventional techniques rather than state machines without departing from the spirit of the subject invention.)

Test controller 100 also includes communications buffer 180 for transfer of data to and from controller 90; test data holding register 190 for temporary storage of test data; command register 200 for temporary storage of TMS signals; and test results holding register 210 for temporary storage of test results data shifted out of the boundary-scan logic of integrated circuits 92 as input TDI.

Test controller 100 generates signal TMS by shifting data out of command register 200. It generates signal TDO by shifting data out of test data holding register 190. Clock signal TCK is generated directly from state machine 170, and, as noted, test results are input as signal TDI.

State machine 170 also generates a Shift Enable signal to enable data to be simultaneously shifted out of register 190 and into register 210, and a Load Communications Buffer signal to transfer results data from register 210 to communications buffer 180. This signal is also sent, with a small delay, to controller 90 to indicate that controller 90 should transfer data from buffer 180 to the test control node, as will be described further below.

Test controller 100 also receives a signal LD TDHR which indicates that a Scan Test Data signal has been received without error and that the data has been loaded into buffer 180 by controller 90, and controls register 190 to load the data from buffer 180. State machine 70 receives signals LDCR from controller 90 when a Scan Command Message has been received without error and responds to generate signal TMS, as will be described below. Signal LDCR also controls command register 200 to load the TMS data from buffer 180. State machine 170 also receives signal SRRR and responds to control communications buffer 180 to load test results data from register 210 and signals controller 90 to transmit the contents of buffer 180 to test control node.

Figure 7:
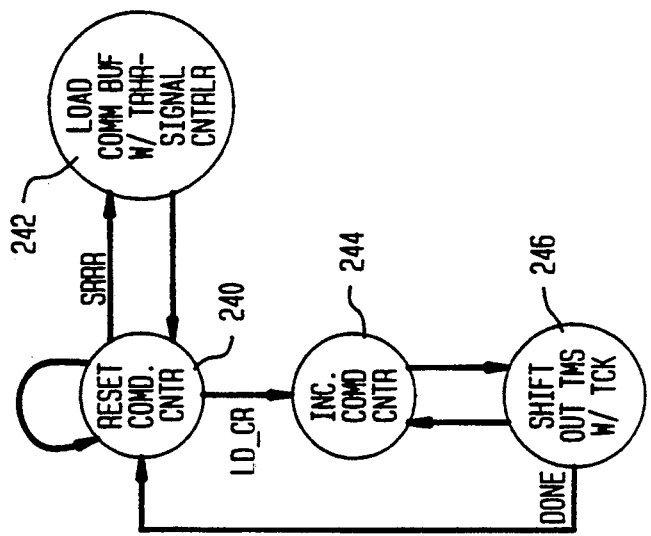
FIG. 7 shows a state diagram of the operation of the test controller of FIG. 6.

FIG. 7 shows a state diagram of the operation of state machine 70. Initially state machine 170 is in reset state 40 and remains there until a signal is received from controller 90. When signal SRRR is received state machine 170 goes to state 242 and generates a Load Communications Buffer signal which controls buffer 180 to load test result data from register 210; and then signals controller 190 to transmit the contents of buffer 180 to the test control node. State machine 170 then returns to state 240. When the signal LDCR is received state machine 170 goes to state 244 and increments command counter 172. State machine 170 then goes to state 246 and shifts out one bit from command register 200 with clock signal TCK to generate signal TMS, and returns to state 244. This loop continues until command counter 172 generates a Done signal (i.e. returns to zero) and state machine 170 returns to state 240. Thus, when signal LDCR is received a predetermined amount of data, preferably one byte, is loaded into command register 200 and shifted out as signal TMS.

Output of test data from register 190 and the simultaneous input of results data to register 210 is controlled by a sub-machine comprised in state machine 170 which is driven by signal TMS in parallel with the TAP controllers of integrated circuits 92, as will be described further below with respect to FIGS. 8 and 9.

Figure 9:
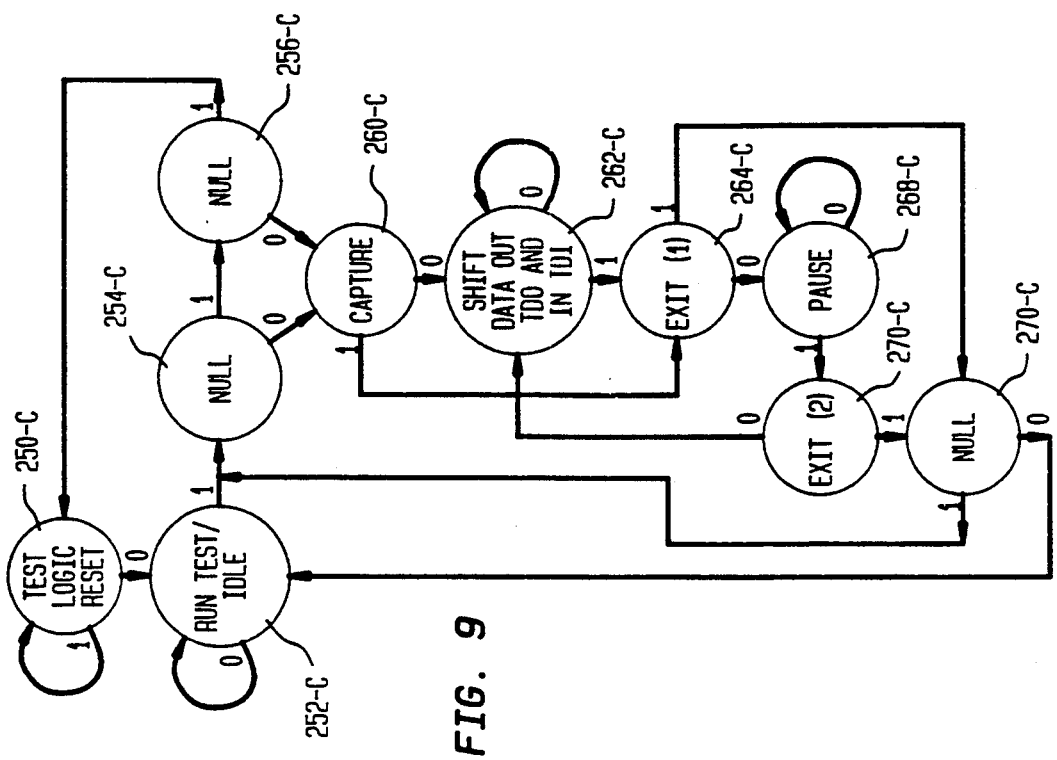
FIG. 9 shows a state diagram of a sub-machine comprised in the test controller of FIG. 6.
Figure 8:
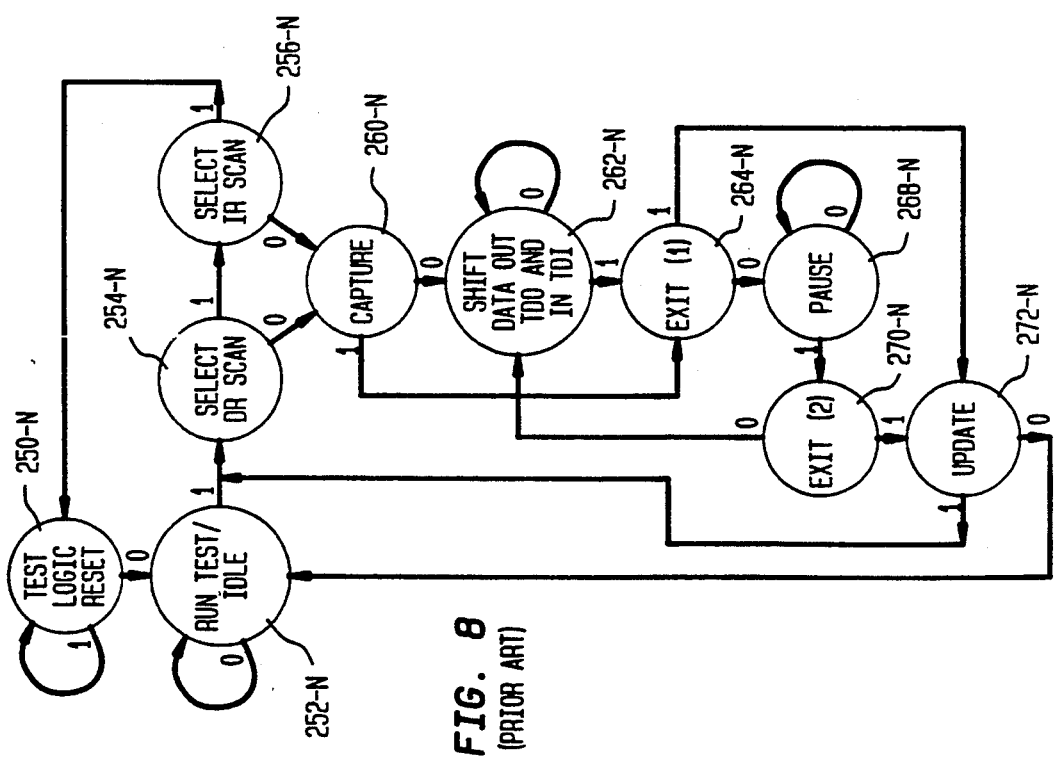
FIG. 8 shows a state diagram of the TAP controller of the boundary-scan logic of FIGS. 1 and 2.

FIGS. 8 and 9 show state diagrams for, respectively, the TAP controllers of integrated circuits 92 and for the sub machine of state machine 170 where both machines are driven by the signal TMS as it is clocked in by TCK. Turning to FIG. 8 the TAP controller is initially in state 250-N and remains in this state until a zero value is detected for signal TMS.

When a zero value for TMS is detected the sub-machine goes to run test/idle state 252-N, and remains in that state as long as zero values continue to be detected. When a one value is detected the sub-machine goes to select DR scan state 254-N, and the TAP controller selects the test data registers of the boundary-scan logic. When a zero is then detected the sub-machine goes to capture state 260-N and waits. If a one is detected in state 254-N the sub-machine goes to the select IR scan state 256-N and selects the instruction register of the boundary-scan logic of integrated circuits 92. If a one is detected in this state the sub-machine returns to reset state 250-N, and if a zero is detected the sub-machine goes to capture state 260-N and waits.

In normal operation the test control node will control the TAP controllers to select either DR or IR scan state and enter capture state 260-N with the first byte of data transmitted with a Scan Command signal. With the next Scan Command message, if a zero value for the TMS signal is detected the TAP controller goes to the state 262-N. In this state each time a zero is detected the TAP controller will shift out one bit of data and return to state 262-N, thus, a data byte of all zeros will shift out eight bits of data. Since the TAP controller remains in state 262-N until a one is detected successive Scan Commands may be used to shift out the full contents of all the boundary-scan logic, though it may be necessary to pad the data if the test data or instruction registers are not even multiples of eight bytes long.

Once a one is detected in state 262-N, or if a one is first detected in state 260-N, the TAP controller enters exit (1) state 264-N. In this state the next value for the TMS signal will normally be a one and the TAP controller will enter update state 272-N. In update state 272-N, the data values which have been shifted into the test data registers of integrated circuits 92 are applied to the pins or logic of integrated circuits 92, or values on the pins are captured in accordance with the contents of the instruction registers. After update state 272-N the test data registers now contain results data for the test. If a one is then detected the TAP controller returns to select DR scan state 254-N, and the above described cycle can be repeated with new data in the test data registers either with or without new data in the instruction registers. If a zero is detected in state 272-N the TAP controller returns to state 252-N and waits.

Returning to state 264-N, if a zero is detected the TAP controller enters pause state 268-N and remains there as long as zeros continue to be detected. This pause state is provided to allow for certain types of devices where clock signal TCK runs continuously. In such a system the TAP controller will remain in state 268-N until a one value is detected, and thus will be unaffected by the continuously running clock. When a one value is detected the TAP controller goes to exit (2) state 270-N. Then a zero value will return it to state 262-N to shift data further and a one value will cause it to enter update state 272-N to generate results data.

Turning to FIG. 9 inspection shows that the state structure of the sub-machine of test controller. 170 is identical to that of all TAP controllers for integrated circuits 92. Since the sub-machine is also driven by signal TMS it will reach state 262-C in synchronism with the TAP controllers and will shift data out of test data holding register 190 and into test results holding register 210 in synchronism with the boundary-scan logic. Note that states 254-C, 256-C and 270-C are null states since test controller 70 does not distinguish between data shifted through the test data registers or the instruction registers of the boundary-scan logic and does not execute an update state. These states are provided to maintain synchronism between the sub-machine and the TAP controller. Those skilled in the art will also recognize that the sub-machine need not have an identical state structure so long as the structure is sufficiently similar to that of the TAP controllers to maintain synchronism. For example, if it is known that clock signal TCK is not continuous the sub-machine need not implement pause state 268-C or exit(2) state 270-C.

In the following example of a test sequence it should be noted that the sub-machine of state machine 170 will exactly parallel the operation of the TAP controllers each time a Scan Command message is transmitted by the test node controller.

1. The test control node sends a Scan Command message with data field 120 equal to "11111111". This data will return the TAP controllers to reset state 250 from any state.

2. The test control node then sends a Scan Command message with field 120 equal to "11110110". This sequence selects the instruction registers of the boundary scan logic and places the TAP controllers in capture state 260.

3. The test controller node sends a Scan Test Data message. Field 120 of this message will contain eight bytes of data to be shifted into the instruction registers. As noted, the data may be padded if the length of the instruction registers is not an even multiple of eight bits. Node 70 temporarily stores this data in holding register 190.

4. The test control node sends eight successive Scan Command messages each with data field 120 equal to "00000000". These Scan Command messages will shift eight bytes of data from holding register 190 through the instruction registers of the boundary-scan logic of integrated circuits 92. Simultaneously, the previous contents of the instruction registers are shifted into results holding register 210.

5. The test control node sends a scan results request message, which contains no data. Test controller 100 transfers the contents of registers 210 to communications buffer 180 and signals controller 90 to return this data to the test control node. Controller 90 returns the data in buffer 180 with its acknowledge message in accordance with the communications protocol in use. Optionally, the test control node may compare the return value of the instruction registers with the expected value.

6. If necessary steps 3, 4 and 5 may be repeated until the entire length of the instruction registers of integrated circuits 92 is filled.

7. The test control node then sends a Scan Command message with data field 120 equal to "11000000". This takes the TAP controllers through exit(l) state 264 and update state 272 (which updates, i.e. activates) the instruction registers, and back to run test/idle state 252.

8. The test control node then sends a Scan Command message with field 120 equal to "00000000". This places the TAP controllers in capture state 260 and selects the test data registers of integrated circuits 92.

9. The test control node then sends a Scan Test Data message where field 120 contains eight bytes of data. This data is temporarily stored by test controller 170 in holding register 190.

10. The test control node then sends eight successive Scan Command messages with data field 120 equal to "00000000". This shifts eight bytes of data out of holding register 190 and through the test data registers of the boundary-scan logic. Simultaneously, the previous contents (i.e. the results of any previous test) are shifted into results holding register 210.

11. The test control node then sends a Scan Results Request message, without data. Test controller 70 responds by transferring data from holding register 210 to communications buffer 180 and signalling controller 90 to transmit the contents of buffer 180 to the test control node. Controller 90 returns the data with the message acknowledgement in accordance with the communication protocol in use. This data constitutes the results of any previous test and maybe examined in accordance with predetermined criteria to detect any failures in node 70.

12. Steps 9, 10 and 11 maybe repeated as necessary until the entire chain of data registers is filled.

13. The test control node sends a Scan Command message with data field 120 equal to "11000000". This takes the TAP controllers through exit (1) state 264 and update state 270 updates, i.e. activates, cell of the test data registers to perform the test, and finally returns to state 252.

14. The test control node may then obtain the results of the test by returning to step 8 and loading the test data registers of the boundary-scan logic with new data, which may be data for another test or null data, while simultaneously shifting out the test results.

15. The test control node may also load new instructions by returning to step 1.

The above descriptions of preferred embodiments of the subject invention have been provided by way of illustration only, and those skilled in art will recognize numerous other embodiments of the subject invention from consideration of the detailed description set forth above and the attached drawings. Accordingly, limitations on the subject invention are only to be found in the claims set forth below.

What is claimed is:

1. A control node responsive to signals transmitted on a communications bus, said control node comprising;
   a) boundary-scan test logic for testing the operability of said node;
   b) first means responsive to a first class of messages comprising said signals for controlling a predetermined function; and
   c) second means responsive to a second class of messages comprising said signals for exercising said boundary-scan logic to test said node.

2. A control node as described in claim 1 wherein said communications bus is a serial bus.

3. A control node as described in claim 2 wherein said first means comprises a communications controller responsive to said first class of messages to generate first control signals, and circuitry responsive to said first control signals to implement said predetermined function; and said second means comprises said communications controller which is responsive to said second class of messages to generate second control signals, and a test controller responsive to said second control signals to exercise said boundary control logic to test said node.

4. A node as described in claim 3 wherein said test controller comprises a state machine.

5. A node as described in claim 3 wherein said second class of messages comprises a scan command message for controlling the state of TAP controllers comprised in said boundary-scan logic.

6. A control node as described in claim 5 wherein said scan command message includes TMS data and said test controller serially transmits said TMS data to said boundary-scan logic.

7. A control node as described in claim 6 wherein said second class of messages includes a scan test data message for transmission of test data to said boundary-scan logic.

8. A control node as described in claim 7 wherein said test data includes instruction data.

9. A control node as described in claim 8 wherein said test controller temporarily stores said test data for later output to said boundary-scan logic.

10. A control node as described in claim 9 wherein said test controller further comprises a sub-machine responsive to a TMS signal transmitted to TAP controllers comprised in said boundary-scan logic for control of the output of said test data.

11. A control node as described in claim 10 wherein the state structure of said sub-machine is substantially similar to the state structure of said TAP controllers, whereby said test controller outputs said data serially in synchronism with said TAP controllers.

12. A control node as describe in claim 7 wherein said test controller temporarily stores results data output by said boundary-scan logic as said test data is input, and said second class of messages includes a scan results request message, said communications controller transmitting said results data on said communications bus in response to said request message.

13. A control node as described in claim 3 wherein said second class of messages includes a scan test data message for transmission of test data to said boundary-scan logic.

14. A control node as described in claim 13 wherein said test data includes instruction data.

15. A control node as described in claim 11 wherein said second class of messages includes a scan test data message for transmission of test data to said boundary-scan logic.

16. A control node as described in claim 15 wherein said test data includes instruction data.

17. A control node as described in claim 1, wherein said control node communicates with a central control node on said communications bus, said central control node generating said first class of messages.

18. A control node as described in claim 17 wherein said central control node further generates said second class of messages.

19. A control node as described in claim 12 wherein said control node communicates with a central control node on said communications bus, said central control node generating said first class of messages.

20. A control node as described in claim 19 wherein said central control node further generates said second class of messages.

* * * * *